FREQUENCY MULTIPLIER CIRCUIT WITH LOW TEMPERATURE DEPENDENCE
Filed Sept. 3, 1969
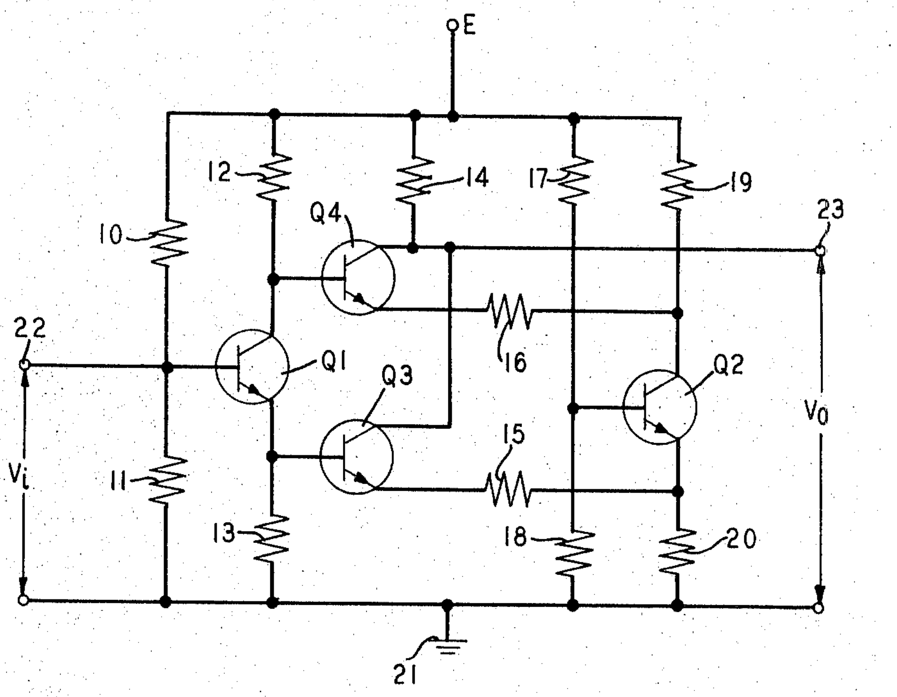
INVENTOR
J. J. GOLEMBESKI
BY [signature]
ATTORNEY United States Patent Office 3,566,247
Patented Feb. 23, 1971

3,566,247

FREQUENCY MULTIPLIER CIRCUIT WITH LOW TEMPERATURE DEPENDENCE

John J. Golembeski, New Providence, N.J., assignor to Bell Telephone Laboratories, Incorporated, Murray Hill, N.J., a corporation of New York Filed Sept. 3, 1969, Ser. No. 854,872
Int. Cl. H02m 5/22
U.S. Cl. 321—60 9 Claims

ABSTRACT OF THE DISCLOSURE

A frequency multiplying circuit utilizes transistors having matched characteristics to eliminate the effects of temperature variations. The input signal is connected to one transistor of a matched pair of transistors having identical bias circuits. The voltages of the emitter terminals and the collector terminals of the two transistors are respectively compared and combined by an output circuit. The resulting output signal contains frequency harmonics of the input signal. Temperature effects are substantially cancelled in the voltage comparison process and thus do not affect the output signal.

BACKGROUND OF THE INVENTION

This invention relates to frequency multiplying circuits with low temperature dependence.

Because of the temperature dependent characteristics of most solid state devices, a problem present in prior art frequency multiplying circuits utilizing such devices is that of drift or change in output caused by temperature variations. The problem is often solved or at least reduced by placing critical circuits in a thermally regulated environment to isolate them from temperature variations. This solution, however, increases the complexity, size, and cost of the apparatus and it is therefore undesirable.

Accordingly, it is an object of this invention to eliminate the effects of temperature variations on the operation of frequency multiplying circuits.

Another object is to provide a frequency multiplying circuit with low temperature dependence which is compatible with integrated circuit technology.

SUMMARY OF THE INVENTION

The foregoing objects and others are achieved in accordance with the principles of the invention by the utilization of transistors having matched characteristics in a frequency multiplying circuit. Such matching can be easily obtained by fabricating or forming multiple devices on a single integrated circuit chip.

The input signal is connected to one transistor of a matched pair of transistors having identical bias circuits. There is no signal input to the other transistor of the pair. The voltage differential between the emitter terminals of the two transistors is applied across the emitter-base junction of a third transistor. Likewise the voltage differential between the collector terminals of the two transistors is applied across the emitter base junction of a fourth transistor. The third and fourth transistors conduct alternately depending upon the polarity of the input signal and their outputs are combined to produce an output signal, the fundamental frequency component of which is double in frequency to the input signal. The use of matched transistors and identical bias points for the first and second transistors eliminates the effects of temperature variations by cancellation.

BRIEF DESCRIPTION OF THE DRAWING

The invention may be more fully comprehended from the following detailed description and accompanying drawing in which the single figure is a schematic diagram of the frequency multiplying circuit of this invention.

DETAILED DESCRIPTION

A schematic diagram of a preferred embodiment of the frequency multiplying circuit of this invention is disclosed in the drawing which shows a pair of transistors Q1 and Q2 which have matched characteristics. Close matching of the characteristics of transistors Q1 and Q2 might advantageously be accomplished by simultaneously forming the transistors on a single integrated circuit chip.

Transistors Q1 and Q2 have substantially identical bias circuits comprising input bias resistors 10 and 11 and input bias resistors 17 and 18, respectively. All of the resistors 10, 11, 17, and 18 might advantageously be made identical to achieve identical bias points for transistors Q1 and Q2. The emitter terminals of transistors Q1 and Q2 are connected to a reference potential 21 by substantially identical resistors 13 and 20, respectively, and the collector terminals are connected to a potential source E through substantially identical resistors 12 and 19, respectively. Resistors 12 and 19 might advantageously also be made identical to resistors 13 and 20.

The emitter terminals of transistors Q1 and Q2 are connected to the base and emitter terminals, respectively, of a transistor Q3. Thus the potential difference between the emitter terminals of transistors Q1 and Q2 appears at the input of transistor Q3. Likewise the collector terminals of transistors Q1 and Q2 are connected to the base and emitter terminals, respectively, of a transistor Q4 and thus the potential difference between these collector terminals appears across the input of transistor Q4. Substantially identical resistors 15 and 16 in the emitter circuits of transistors Q3 and Q4 respectively limit the current through these transistors. A common resistor 14 connects the collector terminals of transistors Q3 and Q4 to the potential source E and an output terminal 23 is also connected to both collector terminals.

Transistors Q3 and Q4 could advantageously have matched characteristics and, additionally, these characteristics could advantageously match those of transistors Q1 and Q2. Thus all transistors could be readily formed on a single integrated circuit chip.

The amplitude gain in the frequency multiplying circuit is a function of the ratio of the value of resistor 14 to the value of resistor 15 or resistor 16. Thus where a multiplication of frequency only is desired, resistor 14 should be substantially identical in value to resistors 15 and 16.

A signal $V_i$ whose harmonic frequencies are to be generated is applied between an input terminal 22 which is connected to the base of transistor Q1 and the reference potential 21 which is normally ground. When the signal $V_i$ is positive transistor Q1 will conduct thereby producing a relatively high potential at its emitter terminal and a relatively low potential at its collector terminal. When these potentials at the emitter and collector terminals of transistor Q1 are compared with the potentials at the emitter and collector terminals, respectively, of transistor Q2, the difference voltage appearing across the inputs of transistors Q3 and Q4, respectively, transistor Q3 conducts and transistor Q4 is off. Thus a signal appears at the collector terminal of transistor Q3 and consequently at the output terminal 23. The magnitude of the output signal equals the magnitude of the input signal when the ratio of resistor 14 to resistor 15 is properly selected.

When the signal $V_i$ is negative, transistor Q4 conducts and transistor Q3 is off. Thus a signal appears at the collector terminal of transistor Q4 and consequently at the output terminal 23. The magnitude of the output signal is again equal to that of the input signal if the ratio of resistor 14 to resistor 16 is properly selected.

Therefore it is apparent that transistors Q3 and Q4 will conduct alternately depending on the polarity of the input signal V*i*. The combination of the signals from the collector terminals of transistors Q3 and Q4 will be an output signal V*o* whose frequency components are harmonically related to the input signal V*i*.

Any changes in temperature which affect transistor Q1 also affect transistor Q2 equally. Thus the changes caused by temperature variations do not appear in the difference voltages which occur across the inputs of transistors Q3 and Q4, and there is essentially no dependence upon temperature variations in the output signal.

The complete frequency multiplying circuit is compatible with integrated circuit technology. Use of such technology would yield the desired close matching of component characteristics.

It is to be understood that the embodiment of the invention disclosed herein is merely illustrative of the principles of the invention. Various modifications thereto might be made by those skilled in the art without departing from the spirit and scope of the invention.

What is claimed is:

1. A temperature independent frequency multiplying circuit comprising, in combination, first and second transistors having closely matched characteristics, each of said transistors having a base, an emitter, and a collector, input means for applying an input signal to said base of said first transistor, first means for comparing the voltages on said emitters of said first and second transistors, second means for comparing the voltages on said collectors of said first and second transistors, and means for developing an output signal responsive to said first and second means whereby said output signal is harmonically related to said input signal and is substantially independent of temperature variations.

2. Apparatus in accordance with claim 1 wherein said first means and said second means comprise third and fourth transistors respectively, each having a base, an emitter, and a collector.

3. Apparatus in accordance with claim 2 including first applying means for applying said voltages on said emitters of said first and second transistors to said base and emitter respectively of said third transistor and second applying means for applying said voltages on said collectors of said first and second transistors to said base and emitter respectively of said fourth transistor, whereby said third and fourth transistors conduct alternately depending upon the polarity of said input signal.

4. Apparatus in accordance with claim 2 wherein said third and fourth transistors have matched characteristics.

5. Apparatus in accordance with claim 4 wherein said characteristics of said third and fourth transistors match said characteristics of said first and second transistors.

6. Apparatus in accordance with claim 5 wherein all of said transistors comprise a single integrated structure.

7. Apparatus in accordance with claim 2 wherein said means for developing comprises an output terminal and means for connecting said collectors of both said third transistor and said fourth transistor to said output terminal

8. Apparatus in accordance with claim 1 including first and second substantially identical bias circuits for biasing said first and second transistors, respectively.

9. A temperature independent frequency multiplying circuit comprising, in combination, first and second substantially identical circuits including first and second transistors, respectively, each of said circuits having first and second output ports, input means for applying a signal to said first circuit, first means for comparing signals from said first output ports, second means for comparing said signal from said second output ports, and means for developing an output signal responsive to said first and second means whereby said output signal is harmonically related to said input signal and effects of temperature variations are eliminated from said output signal.

References Cited

UNITED STATES PATENTS

| | | | |
|---|---|---|---|
| 2,770,728 | 11/1956 | Herzog | 321—60X |
| 3,030,566 | 4/1962 | Collins | 321—69 |
| 3,344,337 | 9/1967 | McCoy et al. | 321—47X |
| 3,411,066 | 11/1968 | Bravenec | 321—8 |
| 3,419,787 | 12/1968 | Baehre | 321—47X |

WILLIAM H. BEHA, Jr., Primary Examiner.

U.S. Cl. X.R.

307—220; 321—43, 47, 65